United States Patent [19]
Tseng et al.

[11] Patent Number: 6,047,114
[45] Date of Patent: *Apr. 4, 2000

[54] METHOD OF CONSTRUCTING TESTING PROCEDURES FOR ANALOG CIRCUITS BY USING FAULT CLASSIFICATION TABLES

[75] Inventors: I-Shih Tseng, Taipei; Ying-Kun Tsao, Changhua Hsien; Shou-Chieh Chang, Ping Tung Hsien; Wei-Lung Mao, Keelung; Yi-Fan Chan, Taipei, all of Taiwan

[73] Assignee: Institute for Information Industry, Taipei, Taiwan

[ * ] Notice: This patent is subject to a terminal disclaimer.

[21] Appl. No.: 08/906,088

[22] Filed: Aug. 5, 1997

[51] Int. Cl.⁷ ..................................................... G06F 9/455
[52] U.S. Cl. ................... 395/500.05; 395/500.03; 395/500.23
[58] Field of Search ................ 395/500.03, 500.23, 395/500.05

[56] References Cited

U.S. PATENT DOCUMENTS 5,099,436  3/1992  McCown et al. ...................... 364/550
5,511,162  4/1996  Hamada et el. ................... 395/183.02
5,515,384  5/1996  Horton, III .............................. 371/22.4
5,544,308  8/1996  Giordano et al. .................. 395/183.02

OTHER PUBLICATIONS

Sujoy Sen, "Simulation–Based Testability Analysis and Fault Diagnosis", IEEE, pp. 136–148, 1996.

Primary Examiner—Kevin J. Teska
Assistant Examiner—Samuel Broda
Attorney, Agent, or Firm—McDermott, Will & Emery

[57] ABSTRACT

The present invention discloses a method of constructing the testing procedure of an analog circuit by applying the fault classification tables of the analog circuit. The constructing method classifies the fault classification tables to establish a decision tree. Entropy definitions are defined and the decision tree is thus established by following the rule of decreasing the entropy values. A search procedure of the decision tree can be performed as to find the failure mode next time when the analog circuit is detected.

20 Claims, 7 Drawing Sheets

| Test point | fault classification table |
|---|---|
| α | {(A) (ABC) (BC) (B)} |
| β | {(AB) (C)} |
| r | {(A) (B) (BC)} |

| fault group Classification Scheme | fault group |
|---|---|
| Exclusive | (A) (B,C,D) |
| Non-Exclusive | (A) (C) (C,D) (B,C,D) (B) |

METHOD OF CONSTRUCTING TESTING PROCEDURES FOR ANALOG CIRCUITS BY USING FAULT CLASSIFICATION TABLES

BACKGROUND OF THE INVENTION

1. Field of the Invention

The present invention relates to a method of constructing the testing procedures of an analog circuit by applying the fault classification tables of this analog circuit. The constructing method classifies the fault classification tables to establish a decision tree. Entropy definitions are defined and the decision tree can be established by following the rule of decreasing the entropy values. A search procedure of the decision tree can be performed as to find the failure mode next time when the analog circuit is detected.

The invention is related to another U.S. patent application Ser. No. 08/906,087 entitled "Method for Constructing Fault Classification Tables of Analog Circuits" assigned to same assignee as the present application and incorporated herein by reference in its entirety.

2. Description of the Prior Art

As electric technologies go on getting progresses, there are kinds of electric products coming into human's life. However, a great deal of control circuits such as digital and analog circuits are needed to control the operations of the electric products. Everyone should agree that the control circuits can be treated as the souls of the electric products. Therefore, the control circuits must pass many testing procedures before obtaining a required design.

An early testing scheme needs to actually implement the designed circuits after completing the circuit diagram, and perform the testing procedures to the actual circuit for detecting whether the designed circuit achieves the design purpose. When the detecting result is out of expect, the circuit designer must modify the circuit diagram and implement the modified circuit for testing again. The above testing procedure keeps going until the modified circuit achieves the designed requirement. However, this testing procedure wastes many circuit materials, and needs professional circuit engineers to perform this detecting routine. Clearly, it is not an efficient testing scheme.

In order to overcome the disadvantage of the conventional scheme, tools derived from computer aided engineering (CAE) is growing up. The CAE is a computer program established in a workstation or a personal computer. A circuit designer uses graphic icon to build a circuit diagram, and then performs a simulation procedure to the designed circuit by using a simulation package. The simulation package is composed of software modules, which compiles the designed circuit diagram and converts it into circuit modules with wires as connections. The simulation procedure inputs a pulse into the circuit modules, and then calculates the voltages (or current) estimations at each node of the circuit modules. Output waveform generated by the simulation procedure is displayed to the designer when the simulation procedure terminates. The designer can modify the circuit diagram and perform the simulation procedure until the designed circuit achieves his requirement. Of course, the CAE can significantly degrade the time for designing a circuit, and furthermore, the CAE also can save many circuit materials that are unnecessarily wasted.

Computer aided testing (CAT) is a tool extending the applications of the CAE and simulation to the field of circuit testing. The CAT tools apply failure modes that insert the fault models but the normal models in parts of the circuit components (for example, a fault model simulates the characteristic of a diode acts when punch through appears), and then starts the simulation procedure to record the output waveform as a fault dictionary. Next time when the circuit is testing, the testing result can be compared with the fault dictionary to find the defect components.

In the present days, only the digital CAT tools have been completely developed. However, the characteristics of the analog circuit are quite different with the digital, and thus the analog CAT tools are deficient now. In the prior skills, such as the article "Simulation-based testability analysis and fault diagnosis" disclosed by Sujoy et al. in IEEE Transaction on Autotestcon on September 1996, only a simple classification scheme is suggested to the test points of the analog circuit.

Unfortunately, each the measured value is not fixed but varies in a tolerance range that is caused by the environment around the circuit and by the defects of the circuit components. For example, the measured value 10 may vary in the tolerance range (8.5, 11.5). However, a larger tolerance range will affect decisions to the measured values. Furthermore, a fault decision may be done while there are many test points are applied, which will bring troubles to the fault dictionary generated by Sujoy et al. What is clearly needed is reliable testing tools for overcoming the disadvantages of the conventional skills.

SUMMARY OF THE INVENTION

The principal object of the invention is to provide a constructing method of an analog circuit by using the fault classification tables of this analog circuit.

The other object of the invention is to provide a reliable testing tool of the analog circuit to find the failure mode by using the minimum test points.

The constructing method according to the invention classifies the fault classification tables to establish a decision tree. Two entropy definitions are defined and the decision tree is thus established by following the rule of decreasing the entropy values. A search procedure of the decision tree can be performed as to find the failure mode next time when the analog circuit is detected.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

A short description for obtaining the fault classification tables is first given before representing how to construct the decision tree.

Figure 4:
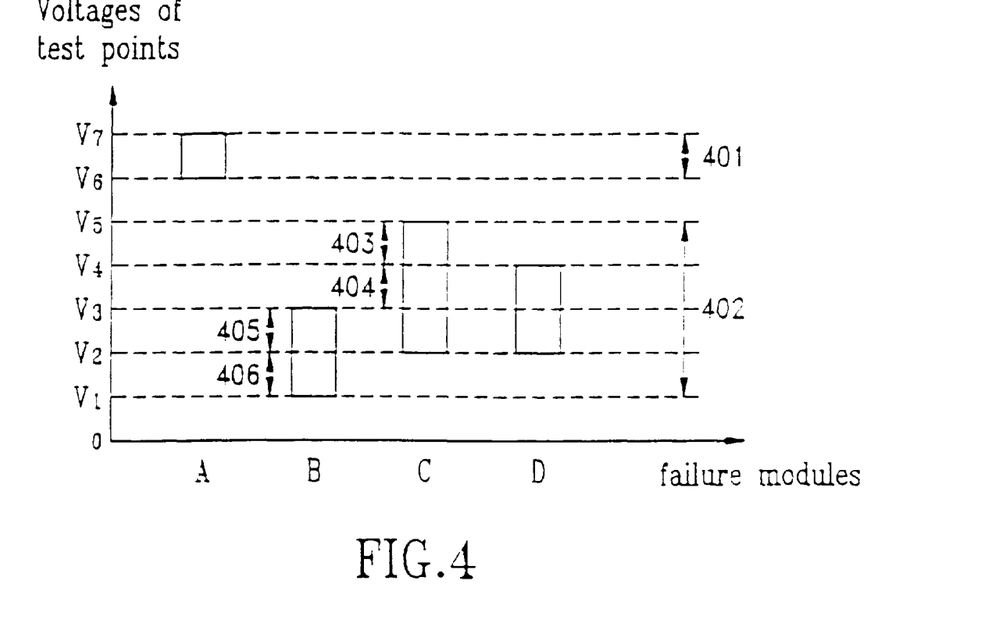
FIG. 4 describes a distribution diagram of an analog circuit with four failure modes in a test point.

FIG. 4 describes the distribution diagram of an analog circuit with four failure modes A, B, C, and D in a test point. The distribution diagram is generated by the MicroSim PSPICE simulator, and assigns the tolerance range according to Monte-Carlo model.

Referring to the FIG. 4, when a measured voltage falls in the range 401 between $V_6$ and $V_7$, it indicates that the fault condition is caused by the failure mode A. When the measured voltage falls in the range 403 between $V_4$ and $V_5$, it indicates that the fault condition is caused by the failure mode C. If the measured voltage falls in the range 406 between $V_1$ and $V_2$, it implies that the fall condition is caused by the failure mode B. It is impossible to recognize that the fault condition is caused by the failure mode C or D when the measured voltage falls in the range 404 between $V_3$ and $V_4$. Similarly, it is also impossible to recognize that the fault condition is caused by the failure mode B, C, or D without further testing information when the measured voltage falls in the range 405 between $V_2$ and $V_3$. Please note that each the failure mode is generated by replacing the fault model of circuit components in parts of the analog circuit. For example, a fault model simulates the characteristic of a diode acts when punch through appears.

Figure 5:
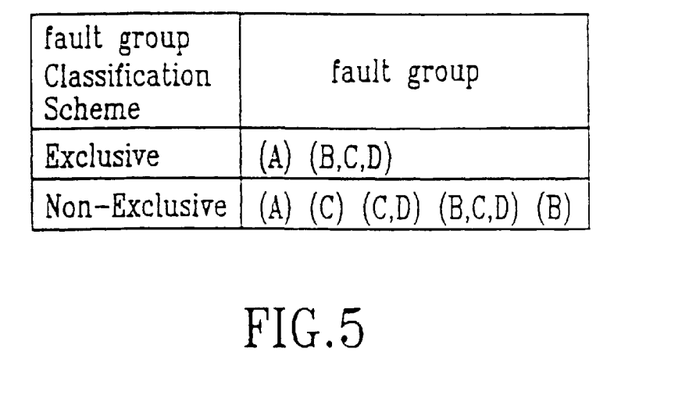
FIG. 5 is a table for representing the fault groups of the analog circuit in the FIG. 4 by using an exclusive and a non-exclusive schemes.

FIG. 5 summaries the fault classification table obtained by the exclusive and non-exclusive schemes. Each failure mode of the fault groups will not be included in other fault groups while the exclusive scheme is applied. For example, the ranges 401 and 402 are exclusive, which respectively include fault groups {(A)} and {(B, C, D)}. In contrast to the exclusive scheme, the non-exclusive scheme divided the test data of a failure mode into several sub-regions while the test data overlaps with others. It implies that each the failure mode may be included in many fault groups. For example, the fault condition may be caused by the failure mode C or D when the test data fails in the range 404, and the fault classification table contains five fault groups {(A), (B), (C), (C, D), (B, C, D)} when the non-exclusive scheme is applied. Therefore, each the test point of the analog circuit can generate a fault classification table.

Please note that each the above-mentioned test data point may contain more than one measured data. For example, the test data may contains measured voltage and measured current. It has no constraint in constructing the correspondence between the test data and the failure modes only by applying one type of measured data.

Figure 1:
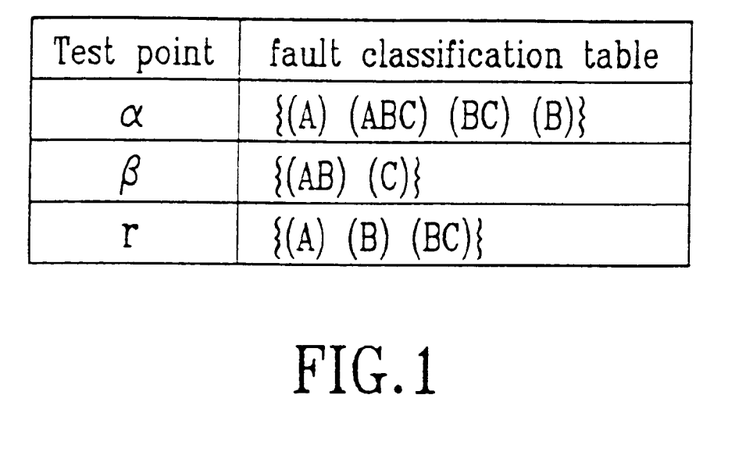
FIG. 1 lists a table representing the fault classification tables of an analog circuit with three test points and three failure modes.

FIG. 1 lists a table representing the fault classification tables of an analog circuit with three test points and three failure modes. Clearly, the fault classification tables in the FIG. 1 are all obtained by using the non-exclusive scheme. Before describing how to establish the decision tree, a suspect group entropy is defined as the rule of constructing this decision tree. When the fault classification table of a test point is input, each the suspect group entropy of a suspect group Sn is defined as:

$$E_{Sn} = -\sum_i (P_i * \ln P_i) \qquad \text{(equation 1)}$$

wherein the $P_i$ represents the appearance probability of the i th failure mode, and ln is the natural log function. By using the fault classification table {(A, B)} as example, please note that the appearance probabilities of both the failure modes A and B are ½. When the failure modes A and B are both included in the suspect group, it implies that this suspect group is defined as {[A, B]}. Thus, the suspect group entropy $E_{\{[A, B]\}}$ of the suspect group {[A, B]} can be calculated according to the (equation 1):

$$E_{\{[A, B]\}} = -\tfrac{1}{2} \times \ln(\tfrac{1}{2}) + (-\tfrac{1}{2} \times \ln(\tfrac{1}{2})) = \ln 2$$

Furthermore, the inference state entropy $E_{IS}$ of an inference state is also defined following:

$$E_{IS} = \sum_j (P_j * E_{sj}) \qquad \text{(equation 2)}$$

wherein the $P_j$ indicates the appearance probability of the j th suspect group in the inference state; and the $E_{sj}$ represents the suspect group entropy of the suspect group. By using the inference state of {[A, B], [C]} as example, the suspect group entropy of the {[A, B]} and {[C]} are respectively ½ ln2 and 0 according to the (equation 1). And thus the inference state entropy of the inference state {[A, B], [C]} can be computed by following the (equation 2):

$$E_{\{[A, B], [C]\}} = \tfrac{1}{2} \times \ln \tfrac{1}{2} + (\tfrac{1}{2} \times 0) = \tfrac{1}{2} \ln 2$$

The decision tree is thus established by using the entropy definitions of the (equation 1) and the (equation 2) hereinafter.

Figure 6A:
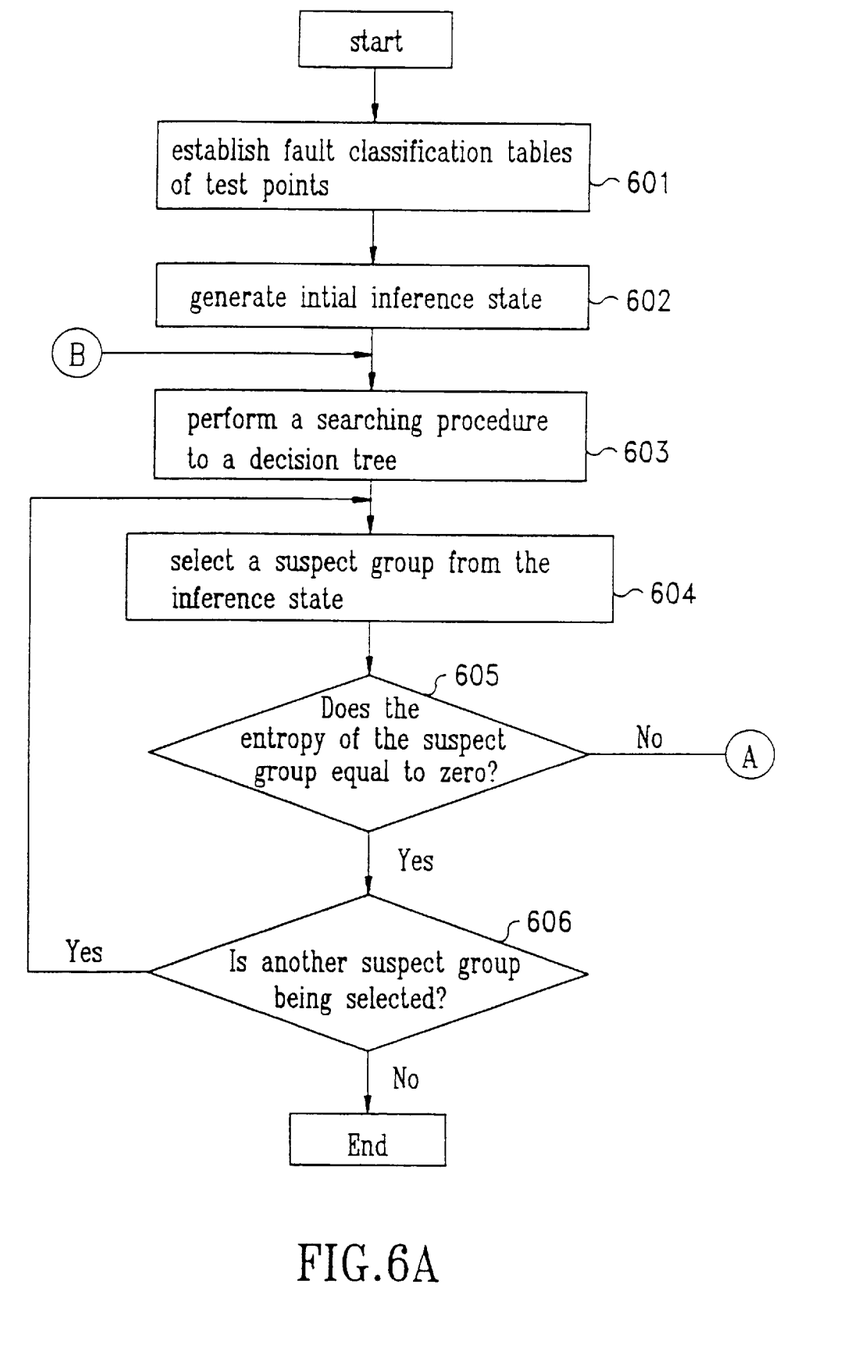
FIG. 6A illustrates a flow chart describing the operations of constructing the decision tree.
Figure 6B:
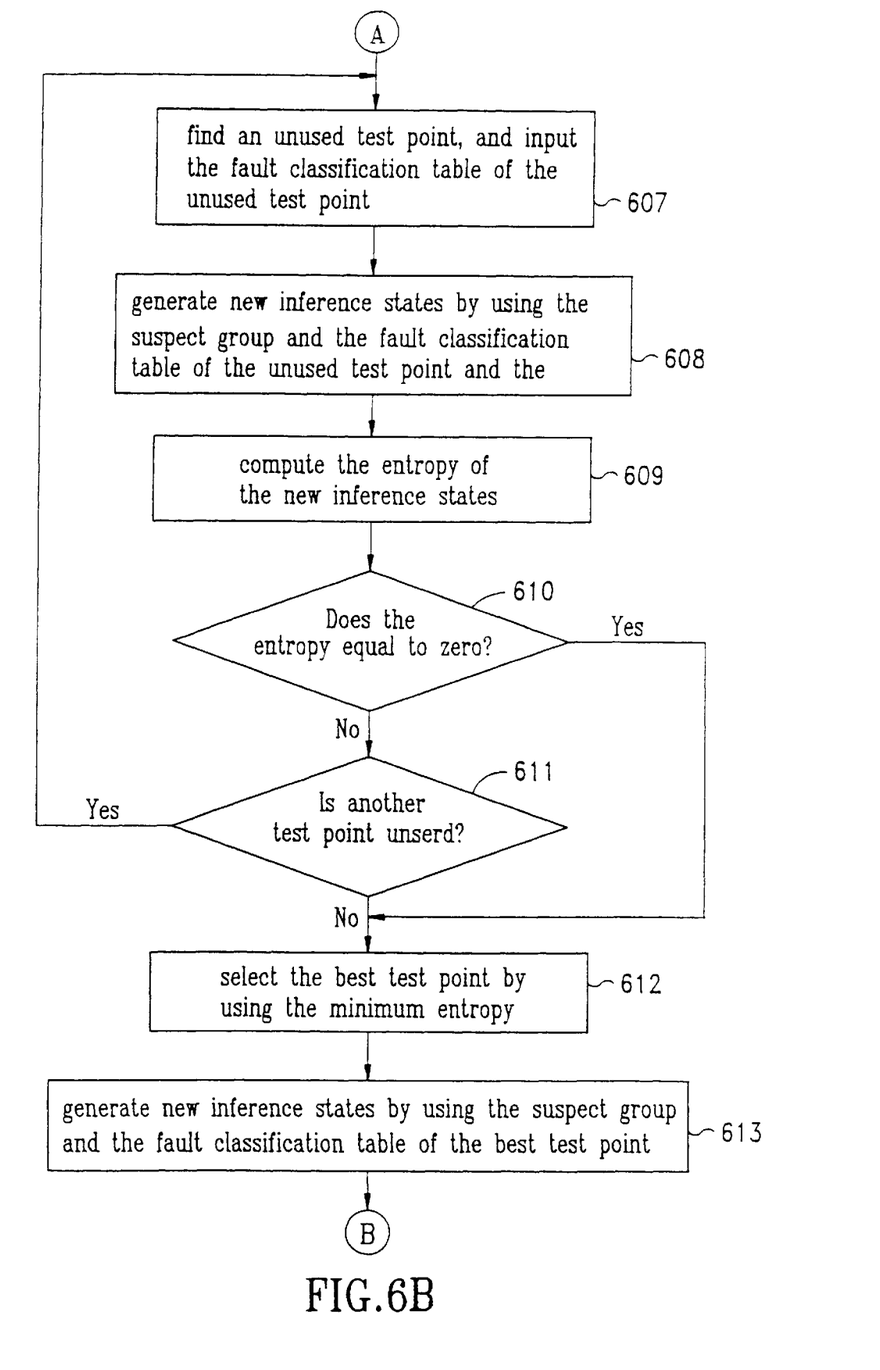
FIG. 6B continues the flow chart of the FIG. 6A.

FIGS. 6A and 6B illustrate a flow chart describing the operations of constructing the decision tree according to the present invention. All the fault classification tables of the test points are established, at first (step 601). After an initial inference state is generated by using all the failure modes of the analog circuit (step 602), the search procedure to the decision tree is then performed (step 603). Because the rule of constructing the decision rule is to observe a suspect group at a time, a suspect group is selected from the initial inference state (step 604), and applies the (equation 1) to compute the suspect group entropy of this selected suspect group. When the computed suspect group entropy is equal to zero, and there are other unused suspect groups in the inference state (steps 605 and 606), another unused suspect group is chosen for continuing this search procedure (returns to step 604).

When the computed suspect group entropy is not zero in the step 605, an unused test point with its fault classification tables is selected (through label A to step 607). A new inference state is generated by using the inference state (the initial inference state now) and the unused fault classification tables (step 608). The inference state entropy of the new inference state is also calculated by using the (equation 2) (step 609). When the inference state entropy of the new inference state is not zero, and there still exists unused test points (steps 610 and 611), the search procedure will repeat the operations of the steps 607 to 611. The purpose of the above-mentioned operations is to find a path with fast decreasing the entropy values as to establish the decision tree.

When the inference state entropy is zero, or all the test points are used, the best test point is selected by finding the minimum inference state entropy (step 612). A further new inference state is then generated by using the fault classification table of the best test point and the current inference state (the new inference state now) (step 613). The search procedure then returns to the step 603 to construct the decision tree (through label B to the 603).

In order to give further explanations to the constructing operations of the FIGS. 6A and 6B, the fault classification tables in the FIG. 1 are applied to establish a decision tree as an example. Before constructing the decision tree, the fault classification tables of the α, β, γ test points must be first established (step 601). Because the analog circuit in the FIG. 1 contains three failure modes A, B, and C, it indicates that the initial inference state {[A, B, C]} is generated by using the failure modes A, B, and C (step 602). Please note again that a suspect group is included by a pair of parentheses '( )', and the inference state is included by a pair of braces '[ ]'.

The search procedure of the decision tree starts after all the fault classification tables and the initial inference state are established (step 603). A suspect group is then selected from the initial inference state. Because the initial inference state only includes a suspect group {[A, B, C]}, there is no choice for selecting another suspect group but this suspect group (step 604). According to the (equation 1), the suspect group entropy of the suspect group {[A, B, C]} is ln3. Clearly, ln3 does not equal to zero (step 605), and another unused test point with its fault classification table is need to be selected as input (step 606 and 607). Furthermore, all the test points α, β, and γ are not used now, any one of them can be selected this time. Assume that the input sequence of the test points is 'α, β, γ'.

Figure 2A:
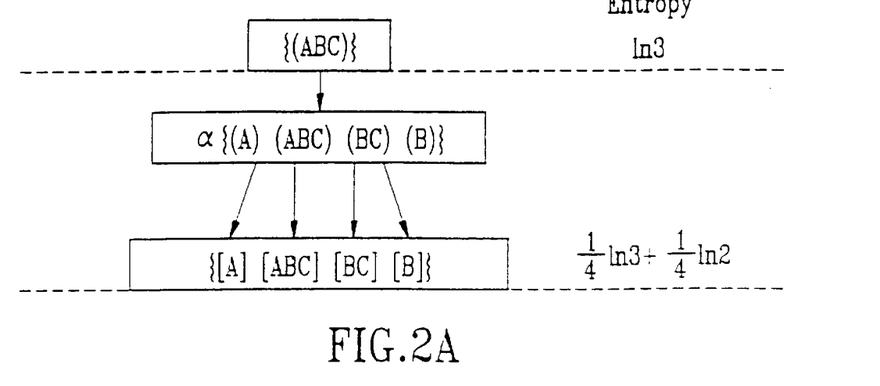
FIG. 2A represents the decision tree established by using the $\alpha$ test point.

Because the initial inference state is {[A, B, C]}, it indicates that all the failure modes A, B, and C are under consideration. When the α test point with its fault classification table is input, the new inference state generated from the initial inference state and the fault classification table will be {[A], [A, B, C], [B, C], [B]} (step 608). According to the (equation 1), the inference state entropy of the new inference state {[A], [A, B, C], [B, C], [B]} is ¼ ln3+¼ ln2 (step 609). The decision tree generated by using the α test point is described in FIG. 2A. Because the inference state entropy value ¼ ln3+¼ ln2 is not zero, and there are two unused test points β and γ (steps 610 and 611), the search procedure will return to the step 607 to choose the β test point as input.

Figure 2B:
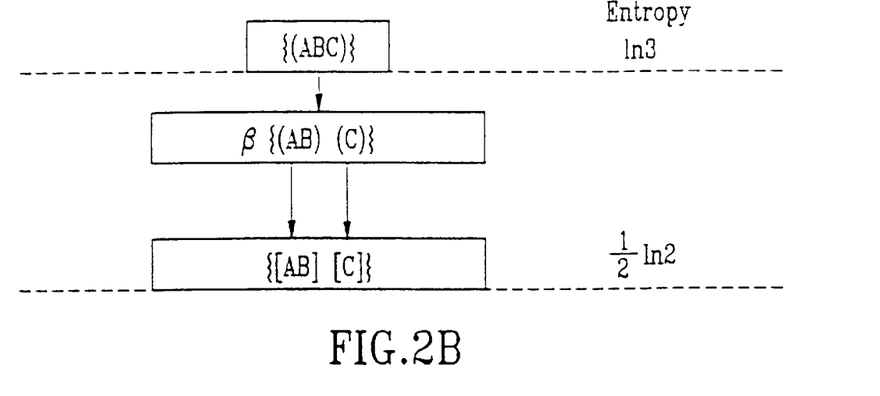
FIG. 2B represents the decision tree established by using the $\beta$ test point.

In the step 608, the new inference state generated by using the suspect group {[A, B, C]} and the fault classification table of the test point β is {[A, B], [C]}. In the step 609, the inference state entropy of the new inference state {[A, B], [C]} is ½ ln2. The decision tree generated by using the β test point is described in FIG. 2B. Once again, the inference state entropy ½ ln2 is not zero (step 610). Moreover, there is an unused test point γ, and the search procedure will return to the step 607 again to input the fault classification table {(A), (B), (B, C)} of the γ test point.

Once again in the step 608, the new inference state generated by using the suspect group {[A, B, C]} and the fault classification table of the test point γ is {[A], [B], [B, C]}. And in the step 609, the inference state entropy of the new inference state {[A], [B], [B, C]} is ⅓ ln2. The decision tree generated by using the γ test point is described in FIG. 2C. The inference state entropy value ⅓ ln2 is also not zero (step 610), and furthermore, there is no unused test point left (step 611), the search procedure will find the best test point by using the minimum entropy (step 612). Because the test point γ has the minimum inference state entropy (i.e., ⅓ ln2), and thus a further new inference state {[A], [B], [B, C]} is generated by using the initial inference state and the fault classification table {(A), (B), (B, C)} of the γ test point. The search procedure then returns to the step 603 for continuing the operations of constructing the decision tree.

Figure 2C:
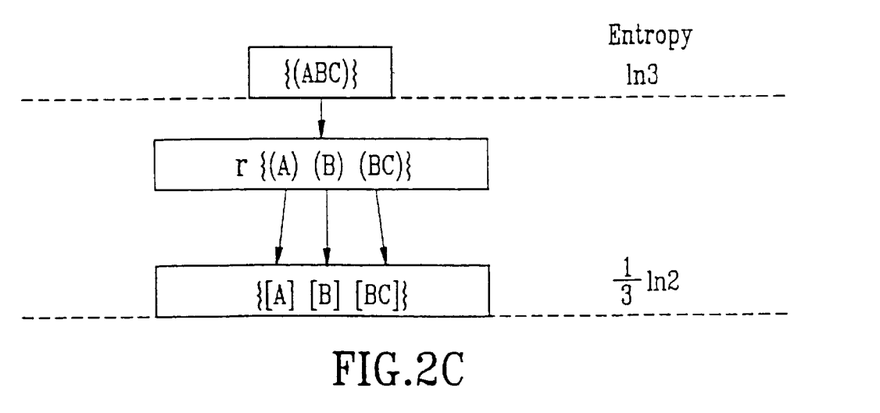
FIG. 2C represents the decision tree established by using the $\gamma$ test point.

In the step 604, a suspect group will be selected from the further new inference state {[A], [B], [B, C]}, and assume the selected one is {[A]}. Because the suspect group entropy of the suspect group {[A]} is zero (step 606), the search procedure will return to the step 604 to choose another suspect group from {[A], [B], [B, C]}. Clearly, only the suspect group {[B, C]} has non-zero suspect group entropy ln2. It also clearly indicates that the decision tree is sequentially established based on the current suspect group {[B, C]}. The search procedure then eliminate the failure mode A from all the following suspect groups but the failure modes B and C.

Figure 3A:
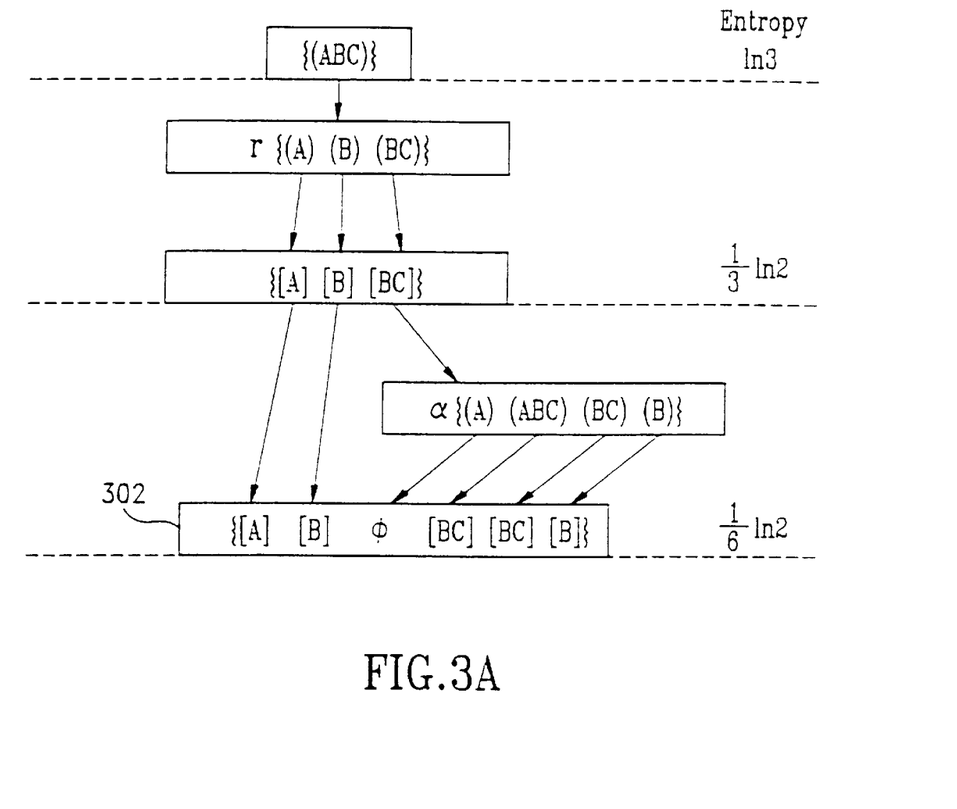
FIG. 3A describes the decision tree illustrated in the FIG. 2C that is sequentially constructed by the $\alpha$ test point.

If the α test point is sequentially input, the fault classification table {(A), (A, B, C), (B, C), (B)} and the current suspect group {[B, C]} will generate a current inference state {φ, [B, C], [B, C], [B]}, wherein the φ indicates an empty set. Please note that the appearance probability of the current suspect group {[B, C]} among the further new inference state {[A], [B], [B, C]} is ⅓. Moreover, the inference state entropy of the current inference state {φ, [B, C], [B, C], [B]} is ½ ln2. It indicates that inference state entropy will be ⅓*½ ln2=⅙ ln2

The current decision tree is described in the FIG. 3A. The inference state entropy ⅙ ln2 does not equal to zero, and furthermore, the β test point is still being unused. The search procedure will return to the step 607 and input the fault classification table {(A, B), (C)}.

Figure 3B:
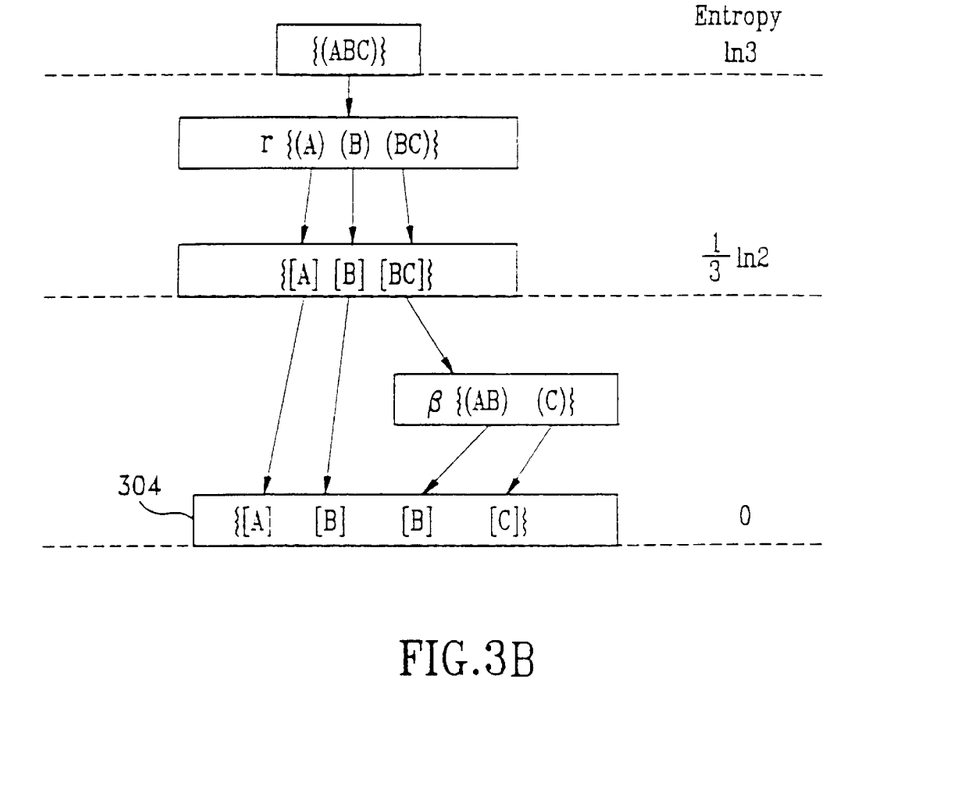
FIG. 3B describes the decision tree illustrated in the FIG. 2C that is sequentially constructed by the $\beta$ test point.

When the β test point is sequentially input, a current inference state {[B], [C]} is generated by using the fault classification table {(A, B), (C)} and the current suspect group {[B, C]}. Please note that the appearance probability of the current suspect group {[B, C]} is ⅓, but the inference state entropy of the current inference state {[B], [C]} is zero. It also indicates that the current inference state entropy also be zero. The current decision tree is described in the FIG. 3B. Because the inference state entropy is zero right now (step 610), the β test point will be the best test point (step 612). The fault classification table {(A, B), (C)} and the further new inference state {[A, B], [C]} then generates a still further new inference state {[A], [B], [B], [C]}. Obviously, each the suspect group entropy of the still further new inference state {[A], [B], [B], [C]} equals to zero. It also indicates that the search procedure completes the construction of the decision tree now, and the decision tree by using the tables of the FIG. 1 is just illustrates in the FIG. 3B.

In conclusion, the present invention discloses a method of constructing the testing procedures for the analog circuits by applying the fault classification tables. Entropy definitions are defined and the decision tree is thus established by following the rule of decreasing the entropy values. A search procedure of the decision tree can be performed as to find the failure mode with minimum test points.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A constructing method of an analog circuit for establishing testing procedures by applying fault classification tables of said analog circuit, wherein said constructing method establishes an analog testing tool by constructing a decision tree, said constructing method comprising the steps of:

establishing said fault classification tables of test points of said analog circuit, wherein each one of said fault classification tables comprises a plurality of fault groups established by at least one failure mode of said analog circuit;

establishing an inference state according to each one of said test points, wherein said inference state comprises at least one of one or more suspect groups to determine a selected test point from said test points;

generating a new inference state of said selected test point to construct said decision tree by using an inference state entropy of said inference state and said fault classification tables of unused test points, wherein said new inference state comprises at least one of said suspect groups and said new inference state is used to determine a next test point which is next to be tested after said selected test point; and terminating operations of said constructing method when all suspect group entropies of said suspect groups in said new inference state are equal to a preset value, or when all said fault classification tables of said test points have been used.

2. The constructing method according to claim 1, wherein said suspect group entropy is generated by using an equation following:

$$E_{Sn} = -\sum_{i}(P_i * \ln P_i)$$

wherein said $E_{Sn}$ represents said suspect group entropy, said $P_i$ represents an appearance probability of said i th failure mode, and said ln represents a natural log function.

3. The constructing method according to claim 2, wherein said inference state entropy is generated by using an equation following:

$$E_{IS} = \sum_{j}(P_j * E_{sj})$$

wherein said $E_{IS}$ is said inference state entropy, said $P_j$ represents an appearance probability of said j th suspect group in said inference state, and said $E_{sj}$ represents said suspect group entropy of said j th suspect group.

4. The constructing method according to claim 1, wherein said step of generating said new inference state to construct said decision tree by using said inference state entropy of said inference state and said fault classification tables of said unused test point comprises the steps of:

selecting a selected suspect group from said suspect groups, wherein said suspect group entropy of said selected suspect group does not equal said preset value;

inputting a next fault classification table by selecting one of said unused test points;

generating said new inference state by using said next fault classification table of said selected unused test point and said selected suspect group;

generating said inference state entropy of said new inference state;

selecting a best test point to be said next test point by using a plurality of said inference state entropy of said new inference states; and constructing said decision tree by using said best test point.

5. The constructing method according to claim 4, wherein said step of generating said new inference state by using said next fault classification table of said selected unused test point and said selected suspect group comprises a step of eliminating all said failure modes excluded in said suspect group.

6. The constructing method according to claim 4, wherein said step of selecting said best test point to be said next test point by using said new inference state is executed when said inference state entropy of said inference state equals to said preset value, or when all said test points have been used.

7. The constructing method according to claim 4, wherein said step of constructing said decision tree by using said best test point comprises a step of generating said new inference state by using said suspect group and a fault classification table of said best test point.

8. A constructing method of analog circuit for establishing testing procedures by applying fault classification tables of said analog circuit, wherein said constructing method establishes an analog testing tool by constructing a decision tree, said constructing method comprising the steps of:

establishing said fault classification tables of test points of said analog circuit, wherein each one of said fault classification tables comprises a plurality of fault groups established by at least one failure mode of said analog circuit;

establishing an inference state according to each one of said test points, wherein said inference state comprises at least one of one or more suspect groups to determine a selected test point from said test points;

generating a new inference state of said selected test point to construct said decision tree by using an inference state entropy of said inference state and said fault classification tables of unused test points, wherein said new inference state comprises at least one of said suspect groups and said new inference state is used to determine a next test point which is next to be tested after said selected test point; and terminating operations of said constructing method when all suspect group entropies of suspect groups in said new inference state are equal to zero, or when all said fault classification tables of said test points have been used.

9. The constructing method according to claim 8, wherein said suspect group entropy is generated by using an equation following:

$$E_{Sn} = -\sum_{i}(P_i * \ln P_i)$$

wherein said $E_{Sn}$ represents said suspect group entropy, said $P_i$ represents an appearance probability of said i th failure mode, and said ln represents a natural log function.

10. The constructing method according to claim 9, wherein said inference state entropy is generated by using an equation following:

$$E_{IS} = \sum_j (P_j * E_{sj})$$

wherein said $E_{IS}$ is said inference state entropy, said $P_j$ represents an appearance probability of said j th suspect group in said inference state, and said $E_{sj}$ represents said suspect group entropy of said j th suspect group.

11. The constructing method according to claim 8, wherein said step of generating said new inference state to construct said decision tree by using said inference state entropy of said inference state and said fault classification tables of said unused test point comprises the steps of:

selecting a selected suspect group from said suspect groups, wherein said suspect group entropy of said selected suspect group does not equal to zero;

inputting a next fault classification table by selecting one of said unused test points;

generating said new inference state by using said next fault classification table of said selected unused test point and said selected suspect group;

generating said inference state entropy of said new inference state;

selecting a best test point to be said next test point by using a plurality of said inference state entropy of said new inference states; and constructing said decision tree by using said best test point.

12. The constructing method according to claim 11, wherein said step of generating said new inference state by using said next fault classification table of said selected unused test point and said selected suspect group comprises a step of eliminating all said failure modes excluded in said suspect group.

13. The constructing method according to claim 11, wherein said step of selecting said best test point to be said next test point by using said new inference state is executed when said inference state entropy of said inference state equals zero, or when all said test points have been used.

14. The constructing method according to claim 11, wherein said step of constructing said decision tree by using said best test point comprises a step of generating said new inference state by using said suspect group and a fault classification tables of said best test point.

15. A constructing method of analog circuit for establishing testing procedures by applying fault classification tables of said analog circuit, wherein said constructing method establishes an analog testing tool by constructing a decision tree, said constructing method comprising the steps of:

establishing said fault classification tables of test points of said analog circuit, wherein each one of said fault classification tables comprises a plurality of fault groups established by at least one failure mode of said analog circuit;

establishing an inference state according to each one of said test points, wherein said inference state comprises at least one suspect group to determine a selected test point from said test points;

generating a new inference state of said selected test point to construct said decision tree by using an inference state entropy of said inference state and said fault classification tables of unused test points, wherein said new inference state comprises said at least one suspect group and said new inference state is used to determine a next test point which is next to be tested after said selected test point, said new inference state being generated by the steps of:

selecting a selected suspect group from said suspect groups, wherein a suspect group entropy of said selected suspect group does not equal a preset value;

inputting a next fault classification table by selecting one of said unused test points;

generating said new inference state by using said next fault classification table of said selected unused test point and said selected suspect group;

generating said inference state entropy of said new inference state;

selecting a best test point to be said next test point by using a plurality of said inference state entropies of said new inference states; and constructing said decision tree by using said best test point; and terminating operations of said constructing method when all said suspect group entropies of said suspect groups in said new inference state are equal to a preset value, or when all said fault classification tables of said test points have been used.

16. The constructing method according to claim 15, wherein said suspect group entropy is generated by using an equation following:

$$E_{Sn} = -\sum_i (P_i * \ln P_i)$$

wherein said $E_{Sn}$ represents said suspect group entropy, said $P_i$ represents an appearance probability of said ith failure mode, and said ln represents a natural log function.

17. The constructing method according to claim 16, wherein said inference state entropy is generated by using an equation following:

$$E_{IS} = \sum_j (P_j * E_{sj})$$

wherein said $E_{IS}$ is said inference state entropy, said $P_j$ represents an appearance probability of said j th suspect group in said inference state, and said $E_{sj}$ represents said suspect group entropy of said j th suspect group.

18. The constructing method according to claim 15, wherein said step of generating said new inference state by using said fault classification tables of said unused test point and said selected suspect group comprises a step of eliminating all said failure modes excluded in said suspect group.

19. The constructing method according to claim 15, wherein said step of selecting said best test point by using said new inference state is executed when said inference state entropy of said inference state equals said preset value, or when all said test points have been used.

20. The constructing method according to claim 15, wherein said step of constructing said decision tree by using said best test point comprises a step of generating said new inference state by using said suspect group and a fault classification table of said best test point.

\* \* \* \* \*